FINE-COARSE TUNING DRIVE UTILIZING BALL BEARING TYPE GEARING TO COUPLE SHAFTS
Filed March 22, 1963

INVENTOR:
ALBERT P. WEINER,
BY Frank J. Thompson
HIS ATTORNEY.

United States Patent Office 3,188,872
Patented June 15, 1965

3,188,872

FINE-COARSE TUNING DRIVE UTILIZING BALL BEARING TYPE GEARING TO COUPLE SHAFTS

Albert P. Weiner, Syracuse, N.Y., assignor to General Electric Company, a corporation of New York Filed Mar. 22, 1963, Ser. No. 267,165
5 Claims. (Cl. 74—10.52)

Figures 2, 4:
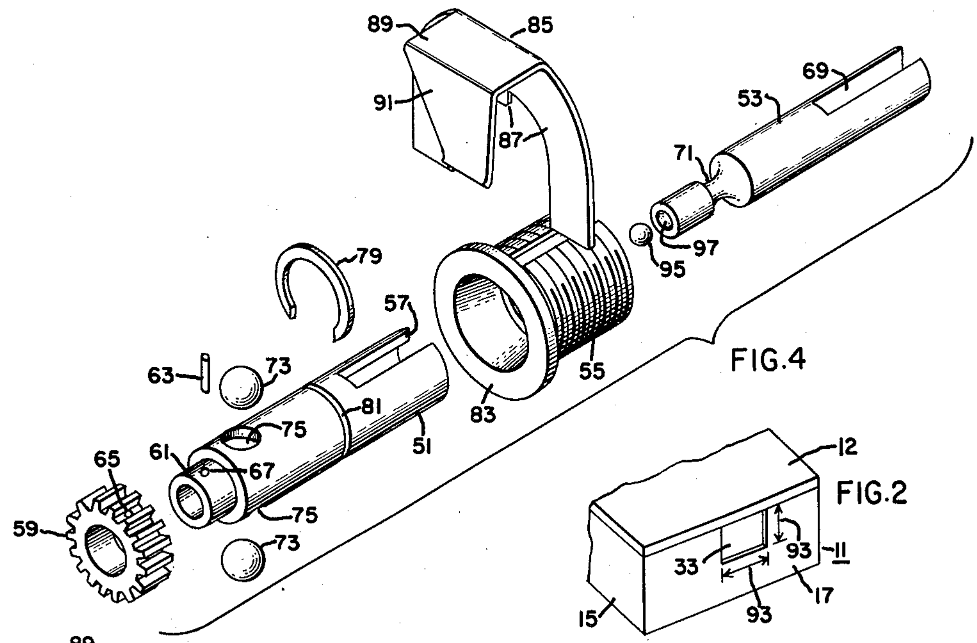

This invention relates to signal channel selecting means for a continuously tunable converter and more particularly to a means for coupling coarse and fine tuning forces to adjustable elements of electrical tuning components in the converter.

A continuously tunable converter is one of a type adapted for selecting each of a plurality of successively higher or lower signal channels within a desired band of frequencies. Known mechanisms for performing this function have included an operator control knob which may be smoothly actuated through the band without intermediate detent action within the limits of the band.

In one form of converter, continuously tunable selection of a desired signal channel is provided by a plurality of electrical components each having adjustable elements thereof operatively coupled to an actuating shaft. An electrical characteristic of each of the components is altered in accordance with a variation in the position of the shaft. As an illustrative example, in one type of continuously tunable converter arrangement, signal channel selection is provided, in an Ultra High Frequency band, by circuits comprising transmission lines which are end tuned by capacitive electrical components. The capacitive components include adjustable rotor elements mounted on an actuating shaft. One end of this shaft, hereinafter referred to as the rotor shaft, extends through a wall of an enclosure for the converter to an exterior point and is thus accessible for coupling a rotational tuning force thereto.

Many continuously tunable converters are adapted for selectively tuning relatively high signal frequencies. For example, a UHF converter for use with television receiving apparatus is required to select signal frequencies within the presently allocated band of 470 mc. to 890 mc. Because of the relatively high frequency of operation, the converter itself generally represents a source of undesirable radiation. Although other spurious frequencies are radiated, the higher levels of radiation are at the fundamental frequency of a local oscillator or harmonics thereof. A high degree of care is consequently required in the arrangement of both electrical components and structural elements in order to reduce the radiation.

In particular, the exterior extending end of the aforementioned rotor shaft has proven to be a relatively high level radiator. For reducing undesirable radiations from the shaft, it has been proposed to position it within the enclosure and to provide means for coupling a tuning force from a point without the enclosure to the shaft. Force coupling means which have heretofore been provided to perform this function are relatively complex, expensive, and at times may even act as a radiator.

In view of the relatively large frequency bands which a converter is required to tune, as in a television receiver, and the generally relatively small bandwidth of a selected channel, means are provided for both coarse and fine tuning the converter to desired channels. The means for fine tuning the converter generally comprise mechanical arrangements for reducing the angular rotation of the rotor shaft with respect to its angular rotation when an equivalent coarse tuning angular rotation is imparted thereto. These arrangements have been relatively complex, cumbersome in mounting on the converter enclosure, consequently expensive, and not readily adaptable to the miniaturization of the converter.

Accordingly, it is an object of the present invention to provide improved coarse and fine tuning means for a continuously tunable converter.

It is another object of the present invention to provide an improved means for coupling coarse and fine tuning forces from a point without a continuously tunable converter enclosure to a rotor shaft positioned therein.

Another object of this invention is to provide relatively uncomplex and inexpensive means for coupling operative coarse and fine tuning forces to an enclosed rotor shaft in a continuously tunable converter.

Another object of this invention is to provide, in a continuously tunable converter having an enclosed rotor shaft, a force coupling means for coupling an operative coarse and fine tuning force to the shaft yet which does not contribute significantly to undesirable radiation from the converter.

Still another object of this invention is to provide a continuously tunable converter having coarse and fine tuning means including relatively uncomplex and inexpensive means for readily mounting the tuning means on an enclosure for the converter.

A further object of this invention is to provide a relatively compact coarse and fine tuning means which contributes to a miniaturization of the converter.

The generally very high frequency of operation of a converter, especially UHF converters, dictates that the arrangement and spacing of electrical and mechanical components be made with a high degree of care. Heretofore, when a converter enclosure was mounted to other apparatus, as for example the chassis of a television receiver, the enclosure became, at times, distorted due to tolerances and variations in mounting holes and brackets. This distortion caused a variation in the critical spacing of the components and resulted in an adverse effect upon the operation of the converter. This adverse effect would be especially noticeable in miniaturized converters.

Thus, it is another object of this invention to provide means for mounting a converter enclosure to other electrical apparatus and which reduces distortion of the enclosure upon mounting.

Another object of the invention is to provide relatively uncomplex and inexpensive means for mounting a converter enclosure to other apparatus.

Another object of the invention is to provide a coarse and fine tuning force coupling arrangement having integral means for mounting the tuner enclosure to other apparatus.

A further object is to provide relatively uncomplex means for mounting a miniaturized converter to other apparatus.

Appearance requirements for consumer electrical apparatus, such as a television receiver, at times dictate the coaxial positioning of coarse and fine tuning knobs which are made available for viewer adjustment. Prior arrangements for providing coaxially positioned knobs for a continuously tuned converter have been relatively complex, expensive, and unsuitable to miniaturization of the converter and reduction in size of the overall apparatus.

A further object of the present invention is to provide relatively uncomplex and inexpensive coaxially positioned coarse and fine tuning drive means for a continuously tunable converter.

Another object of this invention is to provide a tuning means for a miniaturized continuously tunable converter having relatively compact coaxially positioned coarse and fine tuning drive means.

In accordance with the present invention, means are provided in a continuously tunable converter for coupling coarse and fine tuning forces from a point without an enclosure of the converter to a rotor shaft positioned therein. The coupling means includes a coarse tuning drive shaft having an end thereof extending into the enclosure and means for coupling a rotary motion, which is imparted to the drive shaft, to the rotor shaft. A fine tuning shaft is coaxially positioned with the drive shaft and is coupled to the drive shaft by rotary motion speed reduction means. The speed reduction means comprise a ball-planetary arrangement. Mounting means are provided for housing the drive and fine tuning shafts and for positioning the shafts on the enclosure.

A resilient means is provided for both cooperating with the mounting means in securing the mounting means to the converter enclosure and for providing spring loading for a thrust bearing of the force coupling means.

Means are also provided for cooperating with the mounting means for mounting the converter enclosure to other apparatus.

Figures 1, 3:
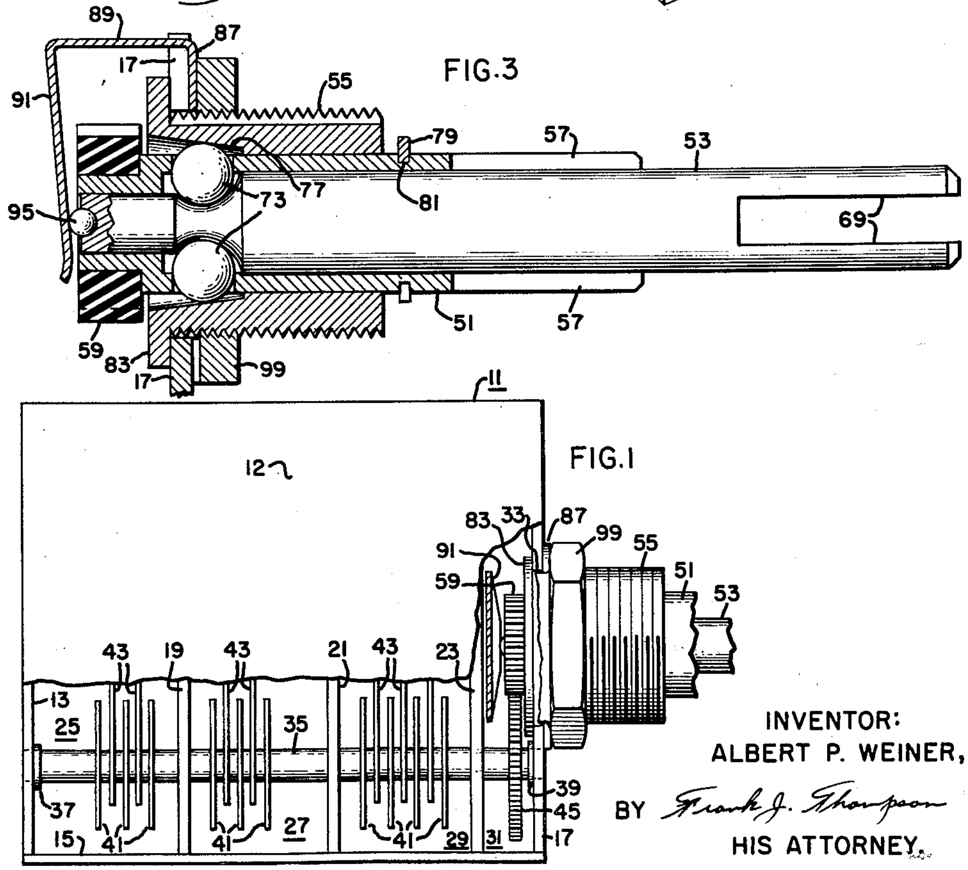

Further objects, features and the attending advantages of the invention will be apparent with reference to the following specifications and drawings in which:

FIGURE 1 is a view of a converter enclosure, partly cut away, and illustrating a rotor shaft and a tuning force coupling means of the present invention mounted in an operative position thereon, FIGURE 2 is a partial perspective view of the converter enclosure of FIGURE 1 illustrating a force coupling means mounting aperture, FIGURE 3 is an assembly view, partly in sectional form, of the tuning force coupling means of the present invention illustrating the force coupling means mounted to a wall of the converter enclosure, and FIGURE 4 is an exploded view of the tuning force coupling means of this invention.

In FIGURE 1, a metal converter enclosure 11 is illustrated. Only those portions of the enclosure and converter are illustrated which are believed necessary for a complete understanding of the present invention. Various other detailed views of the enclosure 11 along with electrical components mounted therein and a circuit arrangement of the components for selecting signal channels in a UHF band are described in copending applications Serial No. 267,275, filed March 22, 1963, and Serial No. 248,522, filed December 31, 1962, each of which is assigned to the assignee of the present invention.

In a cut away section of an enclosure cover 12 is illustrated side walls 13, 15 and 17 and plates 19, 21 and 23 which separate the enclosure into RF, Mixer, Oscillator, and Gear compartments designated respectively as 25, 27, 29 and 31. The wall includes a slotted aperture 33 for mounting a coarse and fine tuning force coupling means thereto as is indicated in more detail hereinafter. The mounting aperture 33 is best seen in FIGURE 2. Although a slotted aperture 33 is illustrated, it will become evident from the following description that the aperture may assume various other configurations.

An electrically conductive rotor shaft 35 is rotatably mounted within the enclosure by any suitable bearings, indicated generally in FIGURE 1 as 37 and 39. The rotor shaft extends through the compartments 25, 27, 29 and 31 and has mounted thereon at positions within the compartments 25, 27 and 29 rotor elements 41 of capacitive tuning components. The elements 41 may be mounted by any conventional means such as a press fit.

Associated capacitive stator elements 43 are also illustrated and are coupled to other electrical components for tuning the other components and thereby selecting a desired signal channel. The other electrical components may comprise transmission lines, not shown, positioned in the compartments 25, 27 and 29 and which are end tuned by the capacitive components for providing frequency selection and conversion.

A drive gear 45 is mounted on a segment of the rotor shaft 35 in the gear compartment 31. The gear 45 may be mounted by any conventional means such as a press fit. Although a single spur gear 45 is illustrated, various well known gear arrangements having back-lash reduction means may be substituted for the gear 45.

Referring now more particularly to the subject of the present invention, tuning force coupling means are provided and are illustrated in detail in FIGURES 3 and 4. The force coupling means comprises a coarse tuning drive shaft 51, a fine tuning shaft 53, and a bushing 55 for housing the shafts 51 and 53.

The drive shaft 51 is tubular and is adapted to be axially positioned within the body of the bushing 55 as indicated in FIGURE 3. A rotary coarse tuning force is coupled directly to the shaft 51 by a control knob, not shown. The knob can be positioned coaxially with the shaft and coupled thereto at slots 57. A gear 59 is also provided and mounted on an end segment 61 of the shaft 51 for coupling the rotary motion of the shaft to the rotor shaft 35. The gear 59 is secured by a pin 63 which is wedged in a hole 65 in the gear and a hole 67 in the segment 61. The shaft 51 when assembled with other elements of the force coupling means is positioned in the aperture 33 of enclosure 11 in a manner for providing extension of the segment 61 into the gear compartment 31 and engagement of the gear 59 with gear 45.

The fine tuning shaft 53 is adapted to be axially positioned within a cavity of the tubular shaft 51. A rotary fine tuning force is coupled directly to the shaft 53 by a control knob, not shown. The knob may be positioned coaxially with the shaft 53 and coupled thereto at a groove 69.

In accordance with a feature of the present invention, rotary motion speed reduction means are provided. To this end, the coarse and fine tuning shafts 51 and 53 are arranged in a manner for coupling a fine tuning force from shaft 53 to 51 but at a reduced angular rotation. In particular, shaft 53 includes a relatively narrow neck segment 71. The neck segment cooperates with a pair of balls 73, which extend from the segment 71 and through a pair of holes 75 in shaft 51 to make frictional contact with a tapered inner surface 77 in the bushing 55, for coupling a rotary fine tuning force from shaft 53 to shaft 51. Shaft 51 is thereby caused to rotate but at the planetary rate of rotation of the balls which is less than that of shaft 53. This speed reduction is determined by the circumference of the bushing surface 77 and by the circumference of the neck segment 71. Thus, a coaxial two speed drive arrangement is described for providing continuous tuning selection in a converter.

In assembled form, axial travel of the shafts 51 and 53 within the bushing 55 is limited by contact between the balls 73 and the tapered inner surface 77 of the bushing and by a washer 79 which is press fitted into a groove 81 in shaft 51.

In accordance with another feature of the present invention, the bushing 55 includes integral means comprising an extending ridge 83 for cooperating with additional means comprising a clip 85 for mounting and securing the force coupling means to the enclosure 11. The clip 85 may be comprised of any suitable spring material and includes a U-shaped segment 87, a flange segment 89, and a third segment 91. Ridge 83 has an outer diameter greater than the dimensions 93 of aperture 33 of enclosure 11 while a main body portion of the bushing 55 has a diameter less than the dimension 93. The bushing may be positioned in the aperture 33 and axial passage to the right as viewed in FIGURE 3 is inhibited by contact between the inner surface of wall 17 and ridge 83. The U-shaped segment 87 of clip 85 is positioned in a straddling manner about the main body portion of bushing 55 on the outer side of wall 17, flange segment 89 extends across the wall 17, and flange 91 extends downward and contacts a thrust ball bearing 95 which is positioned in a cup shaped bearing surface 97 on shaft 53. The assembly is mounted and is secured in position by the cooperation of the integral ridge 83 of bushing 55 and the spring clip 85. In addition, flange segment 91 of clip 85 provides advantageous spring thrust loading for the shaft 53.

Although the ridge 83 is described as circular and having a diameter greater than dimension 93, the ridge may assume other configurations as may also the aperture 33. For mounting and securing the assembly in cooperation with the clip 85, the bushing must have an appurtenance and the aperture must have a configuration which will limit axial motion of the bushing through the aperture.

In accordance with an additional feature of the invention, the bushing includes a main body portion having a threaded outer surface which in cooperation with locking means, shown to comprise nut 99, operates for mounting and securing the enclosure 11 to other apparatus. The other apparatus need only have an aperture through which the bushing may extend. The nut 99 is threaded on the bushing from an opposite surface for securing the enclosure 11 to the apparatus. A nut 99 is shown positioned on the bushing in FIGURES 1 and 3 while in practice, a surface of other apparatus would be positioned between the segment 87 and the nut 99.

It can be seen in FIGURE 1 that the mounted shafts terminate in the gear compartment 31. The metallic wall 23 operates to reduce capacitive and inductive coupling between the shafts and elements within the oscillator compartment 29. The gear 59, which is preferably of a nonconductive material, inhibits conduction of electrical energy via shaft 35 to the force coupling means. Thus, by my arrangement, undesirable radiation is kept to a minimum.

I have described a relatively uncomplex and inexpensive means for providing coarse and fine tuning for a continuously tuned converter. In addition, the arrangement I have described features relatively simple means for mounting the tuning means to a converter enclosure and for mounting the enclosure to other apparatus.

While I have illustrated and described and have pointed out in the annexed claims certain novel features of my invention, it will be understood that various omissions, substitutions and changes in the forms and details of the system illustrated may be made by those skilled in the art without departing from the spirit of the invention and the scope of the claims.

What I claim as new and desire to secure by Letters Patent of the United States is:

1. A means for providing continuous coarse and fine tuning for a converter comprising: a converter having an enclosure, said enclosure having an aperture therein; a rotor shaft rotatably mounted in the enclosure; a gear mounted on said rotor shaft for rotation therewith; a tubular bushing having an inner surface including a tapered ball bearing surface segment and a shaft bearing surface segment; resilient clip means for mounting said bushing in said enclosure aperture; a tubular cylindrical coarse tuning drive shaft having an aperture located in a wall thereof; a drive gear mounted on a segment of said shaft; said drive shaft positioned in said bushing for providing axial alignment of said shaft aperture and ball bearing surface and extension into said enclosure for engagement of said drive and rotor shaft gears; a cylindrical fine tuning shaft having a neck segment thereof of relatively less circumference than a circumference of a main body portion; said fine tuning shaft positioned in a tubular portion of said coarse tuning drive shaft for providing axial alignment between said neck segment and said shaft aperture; said resilient clip means also providing thrust loading for said coarse and said fine tuning shafts; a ball bearing disposed between said neck segment and shaft aperture and partially extending through said shaft aperture for making frictional contact with said ball bearing surface; means for coupling a coarse tuning force to said coarse tuning drive shaft; and means for coupling a fine tuning force to said fine tuning shaft.

2. A means for providing continuous coarse and fine tuning for a converter comprising: a converter having an enclosure; said enclosure including a gear compartment, a wall bordering said gear compartment, and an aperture in said wall; a rotor shaft segment positioned in the gear compartment for rotation therewith; a tubular bushing having an inner surface including a tapered segment and a cylindrical bearing surface segment, a main body portion having a threaded outer surface, and an integral appurtenance; said bushing positioned on said enclosure in a manner for providing extension of said main body portion through said aperture and an abutment of said appurtenance with a surface of said wall; a tubular cylindrical coarse tuning drive shaft having a plurality of apertures located in a wall thereof; a drive gear mounted on a segment of said drive shaft; said drive shaft positioned in said bushing in a manner for providing axial alignment of said shaft aperture and said tapered segment of said bushing and the extension of said gear mounting segment into said gear compartment and engagement of said drive gear with said rotor gear; a cylindrical fine tuning shaft having a neck segment thereof of relatively less circumference than a circumference of a main body portion thereof; said fine tuning shaft positioned in a tubular portion of said coarse tuning drive shaft for providing axial alignment between said neck segment and said apertures in said drive shaft; a plurality of ball bearings disposed between said neck segment and said plurality of apertures in said drive shaft and extending therefrom for providing frictional contact with said tapered surface; a mounting clip having a U-shaped segment, a segment substantially parallel to said U-shaped segment and a flange segment; said clip positioned on said enclosure and about said bushing in a manner for securing said bushing to said enclosure and for providing spring thrust loading for said drive and fine tuning shafts; locking means for cooperating with said threaded outer surface of said bearing for mounting said enclosure to other apparatus; and means for coupling coarse and fine tuning forces to said coarse drive and fine tuning shafts respectively.

3. In a continuously tunable converter having an enclosure for the converter, an aperture extending from a first surface to a second parallel opposite surface in a wall of the enclosure, a rotor shaft rotatably mounted in the converter and a rotary drive arrangement for coupling a tuning force to the rotor shaft, a means for mounting said drive arrangement to the enclosure comprising: a bushing for housing and positioning said drive arrangement on said enclosure; said bushing having a main body portion thereof and an integral appurtenance; said bushing positioned on said enclosure in a manner for providing extension of said main body portion through the aperture beyond the first surface and abutment of said appurtenance with the second surface; and a mounting clip for securing said bushing to said enclosure, said clip comprising a unitary structure of resilient material having a U-shaped segment, a flanged segment joined to said U-shaped segment and substantially perpendicular therewith, and a third segment joined to and extending away from said flange segment and toward said U-shaped segment, said clip positioned on said enclosure in a manner for providing that said U-shaped segment straddles said main body portion and said third segment exerts an axial force on said bushing for maintaining contact between said appurtenance and said second surface.

4. The apparatus of claim 3 wherein said third segment of said clip contacts the rotary drive arrangement housed in said bushing for providing thrust loading for the drive arrangement.

5. The apparatus of claim 4 wherein said main body portion has a threaded external surface for mounting said enclosure to other apparatus in cooperation with thread engaging means.

References Cited by the Examiner

UNITED STATES PATENTS

| | | | |
|---|---|---|---|
| 1,991,846 | 2/35 | Cramer | 74—10.52 |
| 1,993,820 | 3/35 | Behringer | 74—10.52 |
| 2,034,327 | 3/36 | Bussard | 74—10.52 |
| 2,039,622 | 5/36 | Bennett | 74—10.52 |
| 2,095,279 | 10/37 | Newman | 74—10.52 |
| 2,103,517 | 12/37 | De Tar | 74—10.52 |
| 3,098,989 | 7/63 | Metzger et al. | 334—85 |

HERMAN KARL SAALBACH, *Primary Examiner.*